(12) United States Patent
Joshi et al.

(10) Patent No.: US 9,082,698 B1
(45) Date of Patent: Jul. 14, 2015

(54) METHODS TO IMPROVE FINFET SEMICONDUCTOR DEVICE BEHAVIOR USING CO-IMPLANTATION UNDER THE CHANNEL REGION

(71) Applicant: GLOBALFOUNDRIES Inc., Grand Cayman (KY)

(72) Inventors: Manoj Joshi, Clifton Park, NY (US); Johannes Marinus van Meer, Delmar, NY (US); Manfred Eller, Beacon, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/201,122

(22) Filed: Mar. 7, 2014

(51) Int. Cl.
*H01L 21/425* (2006.01)
*H01L 21/265* (2006.01)
*H01L 29/66* (2006.01)
*H01L 29/06* (2006.01)

(52) U.S. Cl.
CPC .......... *H01L 21/265* (2013.01); *H01L 29/0638* (2013.01); *H01L 29/66795* (2013.01)

(58) Field of Classification Search
None
See application file for complete search history.

(56) References Cited

U.S. PATENT DOCUMENTS

| 5,885,861 | A | 3/1999 | Gardner et al. | |
| 6,576,521 | B1 | 6/2003 | Chaudhry et al. | |
| 6,737,337 | B1 | 5/2004 | Chan et al. | |
| 7,700,450 | B2 | 4/2010 | Lee et al. | |
| 7,795,101 | B2 | 9/2010 | Wang et al. | |
| 7,888,223 | B2 | 2/2011 | Lee et al. | |
| 8,674,413 | B1 * | 3/2014 | Chi | 257/213 |
| 2014/0159126 | A1 * | 6/2014 | Wei et al. | 257/288 |
| 2014/0291737 | A1 * | 10/2014 | Hafez et al. | 257/288 |
| 2014/0312393 | A1 * | 10/2014 | Rodder et al. | 257/288 |
| 2014/0339646 | A1 * | 11/2014 | Joshi et al. | 257/392 |
| 2014/0361377 | A1 * | 12/2014 | Jacob et al. | 257/369 |

* cited by examiner

*Primary Examiner* — Asok K Sarkar
(74) *Attorney, Agent, or Firm* — Amerson Law Firm, PLLC

(57) ABSTRACT

One illustrative method disclosed includes, among other things, forming a fin in a substrate, forming a well implant region in at least the substrate, forming a punch-stop implant region in the fin, performing at least one neutral implantation process with at least one neutral implant material to form a neutral boron-diffusion-blocking implant region in the fin, wherein an upper surface of the neutral boron-diffusion-blocking implant region is positioned closer to an upper surface of the fin than either the punch-stop implant region or the well implant region and, after forming the well implant region, the punch-stop implant region and the neutral boron-diffusion-blocking implant region, forming a gate structure above the fin.

21 Claims, 7 Drawing Sheets

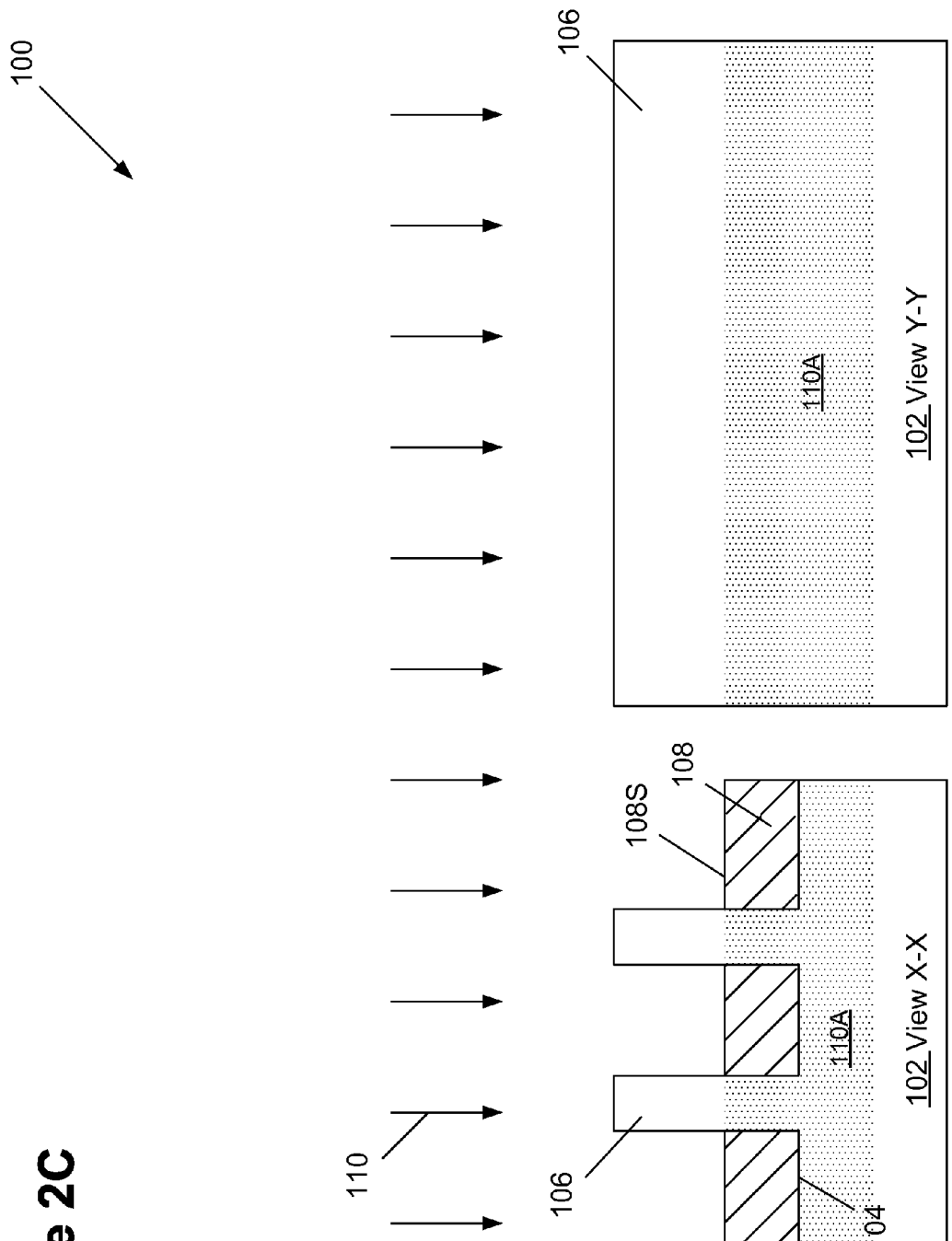

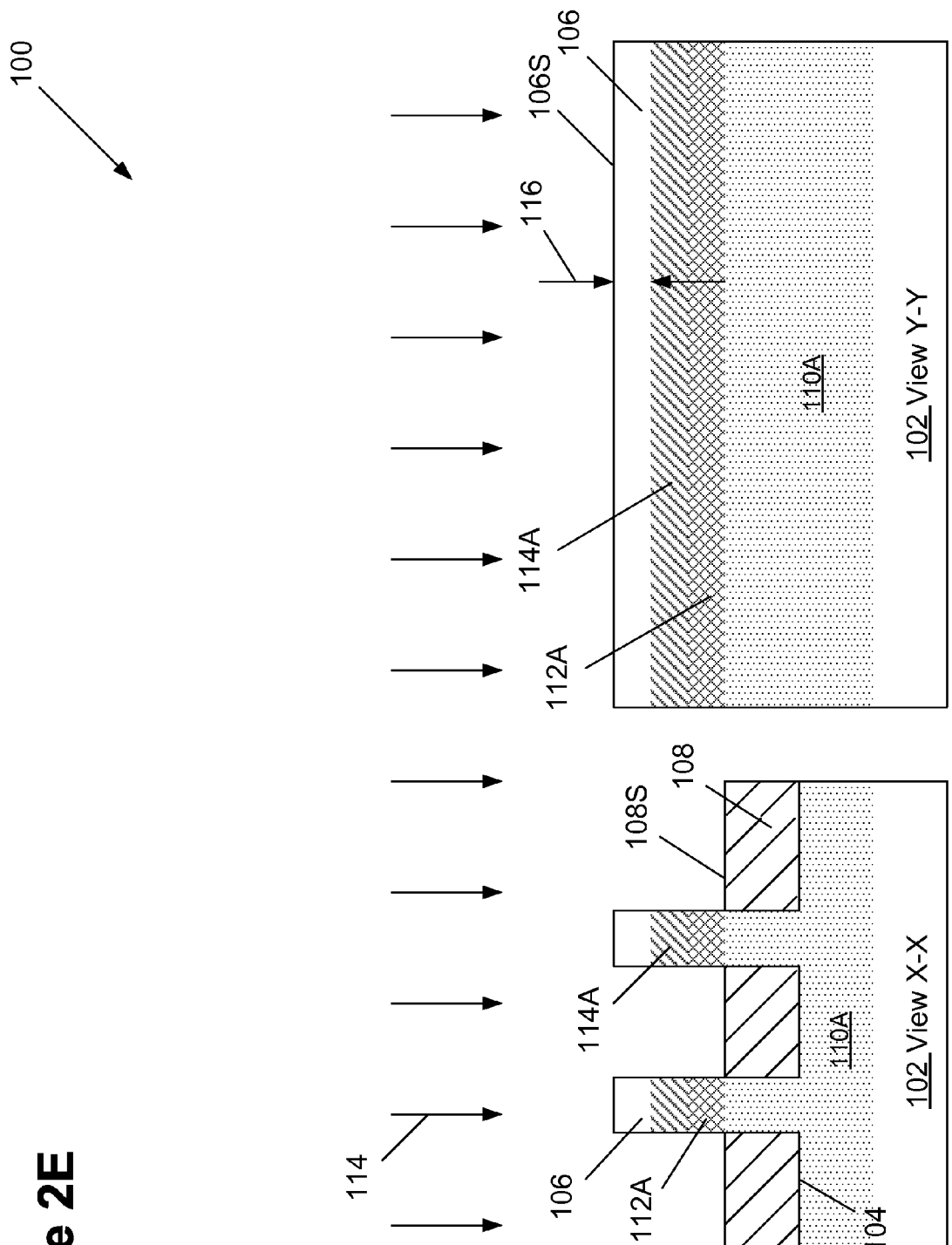

METHODS TO IMPROVE FINFET SEMICONDUCTOR DEVICE BEHAVIOR USING CO-IMPLANTATION UNDER THE CHANNEL REGION

BACKGROUND OF THE INVENTION

1. Field of the Invention

The present disclosure generally relates to the fabrication of integrated circuits, and, more particularly, to various methods of forming a co-implantation region under the channel region of a FinFET semiconductor device and the resulting semiconductor device.

2. Description of the Related Art

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (both NMOS and PMOS transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as FinFET devices.

A field effect transistor (FET), irrespective of whether an NMOS transistor or a PMOS transistor is considered, and irrespective of whether it is a planar or 3D FinFET device, typically comprises doped source/drain regions that are formed in a semiconductor substrate that are separated by a channel region. A gate insulation layer is positioned above the channel region and a conductive gate electrode is positioned above the gate insulation layer. The gate insulation layer and the gate electrode may sometimes be referred to as the gate structure for the device. By applying an appropriate voltage to the gate electrode, the channel region becomes conductive and current is allowed to flow from the source region to the drain region. In a planar FET device, the gate structure is formed above a substantially planar upper surface of the substrate. In some cases, one or more epitaxial growth processes are performed to form epi semiconductor material in recesses formed in the source/drain regions of the planar FET device. In some cases, the epi material may be formed in the source/drain regions without forming any recesses in the substrate for a planar FET device. The gate structures for such planar FET devices may be manufactured using so-called "gate-first" or "replacement gate" (gate-last) manufacturing techniques.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. FIG. 1 is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap F. The gate structure D is typically comprised of a layer of insulating material (not separately shown), e.g., a layer of high-k insulating material or silicon dioxide, and one or more conductive material layers (e.g., metal and/or polysilicon) that serve as the gate electrode for the device A. The fins C have a three-dimensional configuration: a height H, a width W and an axial length L. The axial length L corresponds to the direction of current travel in the device A when it is operational. The portions of the fins C covered by the gate structure D is the channel region of the FinFET device A. In a conventional process flow, the portions of the fins C that are positioned outside of the spacers E, i.e., in the source/drain regions of the device A, may be increased in size or even merged together (a situation not shown in FIG. 1) by performing one or more epitaxial growth processes. The process of increasing the size of or merging the fins C in the source/drain regions of the device A is performed to reduce the resistance of source/drain regions and/or make it easier to establish electrical contact to the source/drain regions. Even if an epi "merger" process is not performed, an epi growth process will typically be performed on the fins C to increase their physical size. In the FinFET device A, the gate structure D may enclose both sides and the upper surface of all or a portion of the fins C to form a tri-gate structure so as to use a channel having a three-dimensional structure instead of a planar structure. In some cases, an insulating cap layer (not shown), e.g., silicon nitride, is positioned at the top of the fins C and the FinFET device only has a dual-gate structure (sidewalls only). The gate structures D for such FinFET devices may be manufactured using so-called "gate-first" or "replacement gate" (gate-last) manufacturing techniques.

Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. When an appropriate voltage is applied to the gate electrode of a FinFET device, the surfaces (and the inner portion near the surface) of the fins C, i.e., the vertically oriented sidewalls and the top upper surface of the fin, form a surface inversion layer or a volume inversion layer that contributes to current conduction. In a FinFET device, the "channel-width" is estimated to be about two times (2×) the vertical fin-height plus the width of the top surface of the fin, i.e., the fin width (for a tri-gate device). Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

Integrated circuit products are typically manufactured using transistor devices that have differing target gate lengths. As device dimensions continue to shrink, the FinFET transistor devices tend to exhibit different electrical performance characteristics depending on, among other things, the target gate length for the FinFET transistor device. For example, FinFET transistor devices are conventionally thought of as being "short-channel" devices or "long-channel" devices. Of course, the distinction between a short-channel device and a long-channel device is one of degree, opinion and interpretation based upon the then-current device technology node. For example, using current day technology, a long-channel FinFET device may be thought of as a transistor device having a gate length of about 50 nm or greater, whereas short-channel FinFET devices may be considered to be those having a gate length of less than about 40 nm. As it relates to short-channel FinFET devices, the threshold voltage ($V_t$) of as-manufactured short-channel FinFET devices tends to correspond relatively closely to the target threshold voltage for such short-channel FinFET devices. However, for long-channel FinFET devices, particularly long-channel N-type FinFET devices, the threshold voltage of the as-built devices tends to be lower than the target threshold voltage of the FinFET semiconductor device. In numeric terms, as one example, the threshold voltage of the long-channel devices may be about 100 mV lower than the target threshold voltage anticipated by the design process. As such, the design of the integrated circuit products may be compromised by virtue of the variations in the as-built threshold voltages as compared to the design, or target, threshold voltages of the FinFET devices.

The present disclosure is directed to various methods of forming a co-implantation region under the channel region of a FinFET semiconductor device and the resulting semiconductor device that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a co-implantation region under the channel region of a FinFET semiconductor device and the resulting semiconductor device. One illustrative method disclosed includes, among other things, forming a plurality of trenches in a semiconductor substrate to thereby define a fin, performing a well ion implantation process to form a well implant region in at least the substrate, performing a punch-stop implant process to form a punch-stop implant region in the fin, performing at least one co-implantation process with at least one co-implant material to form a neutral boron-diffusion-blocking implant region in the fin, wherein the neutral boron-diffusion-blocking implant region is positioned under what will become the channel region of the device and extends into what will become the source/drain regions of the device, and wherein the neutral boron-diffusion-blocking implant region is positioned above the punch-stop implant region or the well implant region and, after forming the well implant region, the punch-stop implant region and the neutral boron-diffusion-blocking implant region, forming a gate structure above the fin.

Another illustrative method disclosed herein includes, among other things, forming a plurality of trenches in a semiconductor substrate to thereby define a fin, performing a well ion implantation process to form a well implant region in at least the substrate, performing a punch-stop implant process to form a punch-stop implant region in the fin, forming a neutral boron-diffusion-blocking implant region comprised of carbon and/or germanium and/or nitrogen in the fin, wherein the neutral boron-diffusion-blocking implant region is positioned under what will become the channel region of the device and extends into what will become the source/drain regions of the device, and wherein the neutral boron-diffusion-blocking implant region is positioned above the punch-stop implant region or the well implant region by performing a carbon ion implantation process and a germanium ion implantation process and/or a nitrogen implantation process, and, after forming the well implant region, the punch-stop implant region and the neutral boron-diffusion-blocking implant region, forming a gate structure above the fin.

BRIEF DESCRIPTION OF THE DRAWINGS

The disclosure may be understood by reference to the following description taken in conjunction with the accompanying drawings, in which like reference numerals identify like elements, and in which:

FIGS. 2A-2F depict one illustrative method disclosed herein of forming a co-implantation region under the channel region of a FinFET semiconductor device and the resulting semiconductor device.

Figure 1:
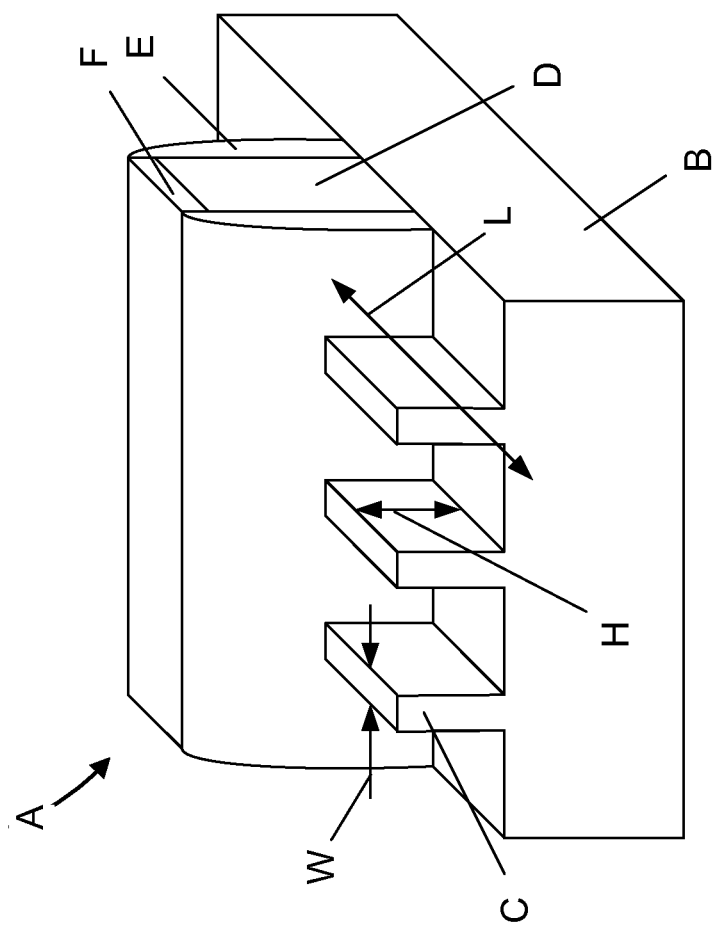
FIG. 1 is a perspective view of one illustrative embodiment of a prior art FinFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming a co-implantation region under the channel region of a FinFET semiconductor device and the resulting semiconductor device. Moreover, as will be readily apparent to those skilled in the art upon a complete reading of the present application, the present method is applicable to a variety of devices, including, but not limited to, logic devices, memory devices, etc. The methods and devices disclosed herein may be employed in manufacturing products using a variety of technologies, and they may be employed in manufacturing a variety of different devices, e.g., memory devices, logic devices, ASICs, etc. With reference to the attached figures, various illustrative embodiments of the methods and devices disclosed herein will now be described in more detail.

In one embodiment, the illustrative device 100 will be formed in and above the semiconductor substrate 102, having a bulk configuration. In the illustrative example depicted herein, the device 100 is an N-type FinFET device. Additionally, various doped regions, e.g., source/drain regions, halo implant regions, well regions and the like, are not depicted in the attached drawings. The substrate 102 may be made of silicon or it may be made of materials other than silicon. Thus, the terms "substrate" or "semiconductor substrate" should be understood to cover all semiconducting materials and all forms of such materials. The various components and structures of the device 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

In general, the subsequent drawings contain a simplistic plan view and various cross-sectional views. As shown in a simplistic plan drawing shown in the upper right corner of FIG. 2A only, the view "X-X" is a cross-sectional view taken through the source/drain regions of the device 100 in the gate-width direction of the device 100, while the view "Y-Y" is a cross-sectional view that is taken through the long axis of an illustrative fin, i.e., a cross-sectional view along the long-axis of the fin through the gate structure in the gate-length direction (current transport direction) of the transistor device.

Figure 2A:
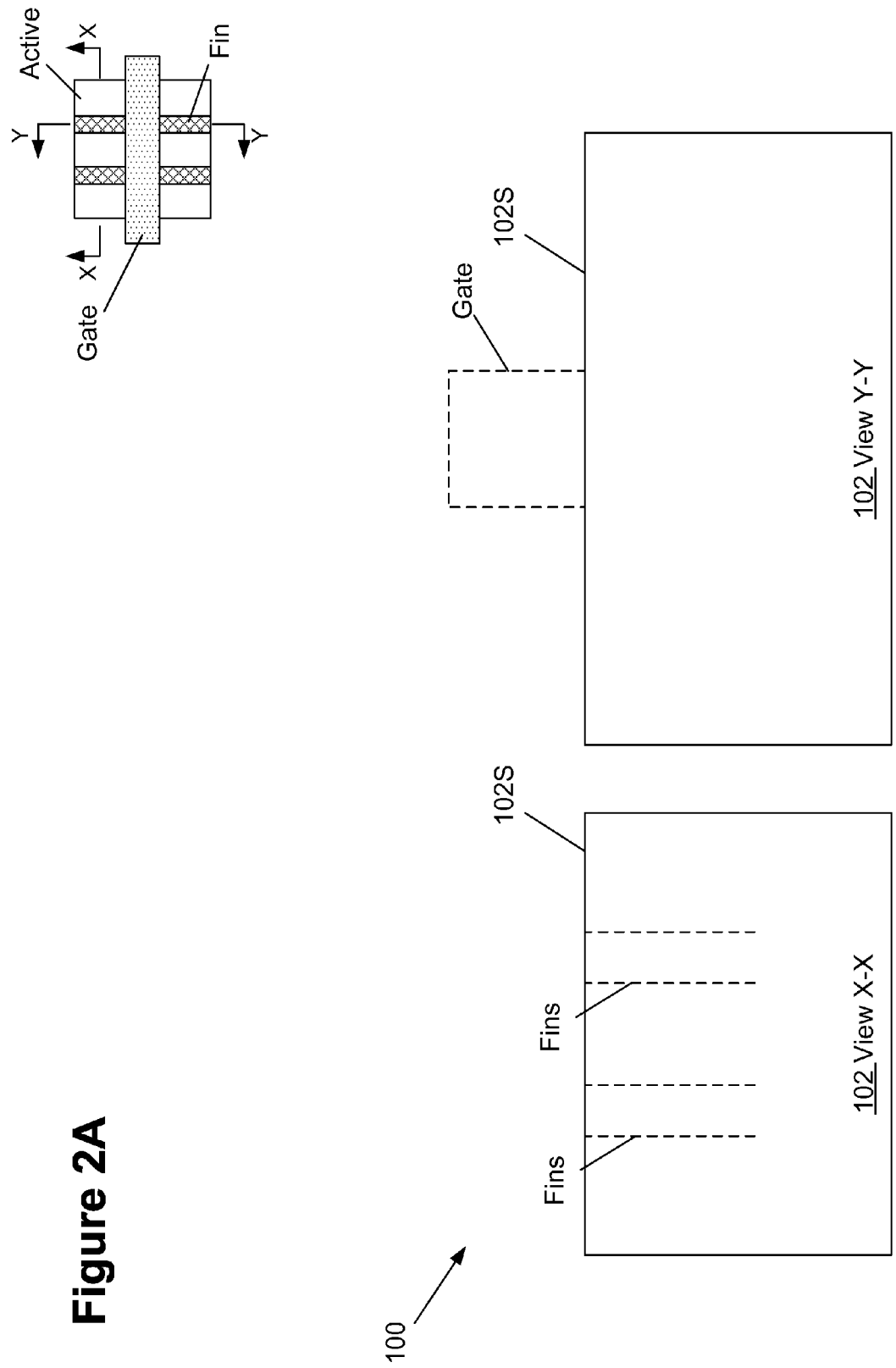

At the point in fabrication depicted in FIG. 2A, an isolation material (not shown) may be formed in the substrate 102 to define spaced-apart active regions in the substrate 102. The isolation regions may be formed using traditional techniques, e.g., traditional shallow trench isolation regions may be formed in the substrate 102. In the case of FinFET devices, the isolation regions may be formed before or after the formation of the fin structures that will be formed as described more fully below. At the point of fabrication depleted in FIG. 2A, the substrate 102 has an exposed upper surface 102S. For reference purposes only, the approximate location of the yet-to-be-formed gate structure and the yet-to-be-formed fins for the device 100 are shown in dashed lines in FIG. 2A.

Figure 2B:
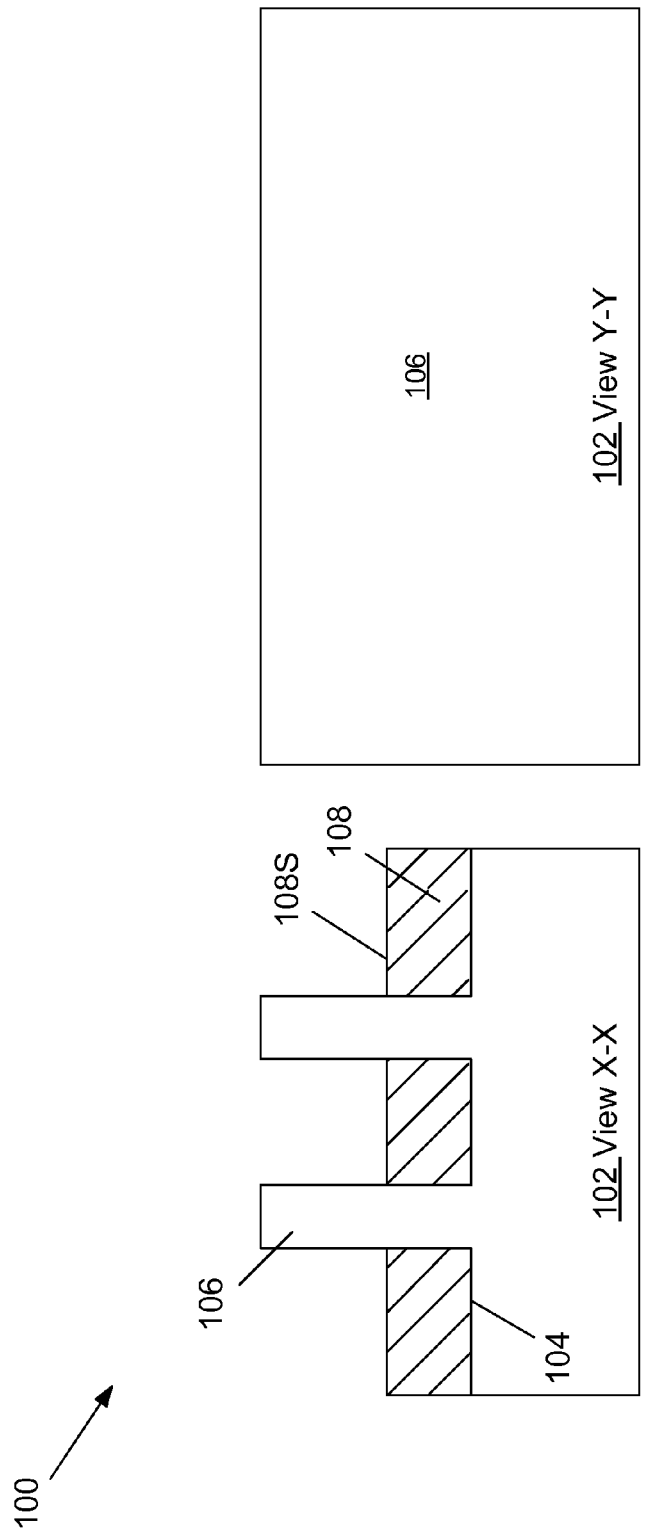

FIG. 2B depicts the device 100 after several additional process operations were performed. First, one or more etching processes, e.g., anisotropic etching processes, were performed through a patterned etch mask (not shown) to define a plurality of fin-formation trenches 104 in the substrate 102. The formation of the trenches 104 results in the formation of a plurality of initial fin structures 106. Thereafter, a recessed layer of insulating material 108, such as a layer of silicon dioxide, was formed in the trenches 104 between the fins 106. In one illustrative embodiment, the recessed layer of insulating material 108 may be formed by blanket-depositing the initial layer of insulating material across the device so as to over-fill the trenches 104. Thereafter, an optional chemical mechanical polishing (CMP) process may be performed to planarize the upper surface of the layer of material 108. Then, a timed, recessing etch-back process may be performed on the layer of insulating material 108 to recess the upper surface 108S of the layer of insulating material 108 to the desired height level, thereby exposing a desired amount of the fins 106 above the recessed surface 108S. The layer of material 108 may be comprised of a variety of different materials, such as silicon dioxide, etc., and it may be formed by performing a variety of techniques, e.g., chemical vapor deposition (CVD), etc.

The width and height of the fin structures 106 as well as the depth of the trenches 104 may vary depending upon the particular application. Additionally, the overall size, shape and configuration of the fin-formation trenches 104 and fins 106 may vary depending on the particular application. In the illustrative examples depicted in the attached drawings, the fin-formation trenches 104 and fins 106 are all depicted as having a uniform size and shape. However, such uniformity in the size and shape of the fin-formation trenches 104 and the fins 106 is not required to practice at least some aspects of the inventions disclosed herein. In the attached figures, the fin-formation trenches 104 are depicted as having been formed by performing an anisotropic etching process that results in the fin-formation trenches 104 having a schematically depicted, generally rectangular configuration. In an actual real-world device, the sidewalls of the fin-formation trenches 104 may be somewhat inwardly tapered, although that configuration is not depicted in the attached drawings. In some cases, the fin-formation trenches 104 may have a reentrant profile (not shown) near the bottom of the fin-formation trenches 104. To the extent the fin-formation trenches 104 are formed by performing a wet etching process, the fin-formation trenches 104 may tend to have a more rounded configuration or non-linear configuration as compared to the generally rectangular configuration of the fin-formation trenches 104 that are formed by performing an anisotropic etching process. Thus, the size and configuration of the fin-formation trenches 104, and the manner in which they are made, as well as the general configuration of the fins 106, should not be considered a limitation of the present invention. For ease of disclosure, only the substantially rectangular fin-formation trenches 104 and fins 106 will be depicted in the subsequent drawings. Moreover, the device 100 may be formed with any desired number of fins 106.

The methods disclosed herein involve forming various doped regions in the substrate/fins of the FinFET device 100. As will be appreciated by those skilled in the art after a complete reading of the present application, the various doped regions disclosed herein may be formed in any desired order. Thus, the illustrative ordered sequence depicted herein for the formation of doped regions should not be considered to be a limitation of the presently disclosed inventions.

FIG. 2C depicts the device 100 after a well ion implantation process 110 was performed on the device 100 to define a well implant region 110A in the substrate 102. In the case where the device 100 is an N-type FinFET device, the well ion implantation process may be performed using a P-type dopant material, such as boron or boron di-fluoride. The dopant dose and the implant energy used during the well implant process 110 may vary depending on the particular application. In one illustrative embodiment, the well implant process 110 may be performed using boron at a dopant dose that falls within the range of $1e^{12}-1e^{14}$ ion/cm² and an energy level that falls within the range of 1-100 keV. The dopant concentration of the well implant region 110A may also vary depending upon the particular application. In one illustrative embodiment, the well implant region 110A may have a dopant concentration of about $1e^{17}-1e^{19}$ ion/cm³.

Figure 2D:
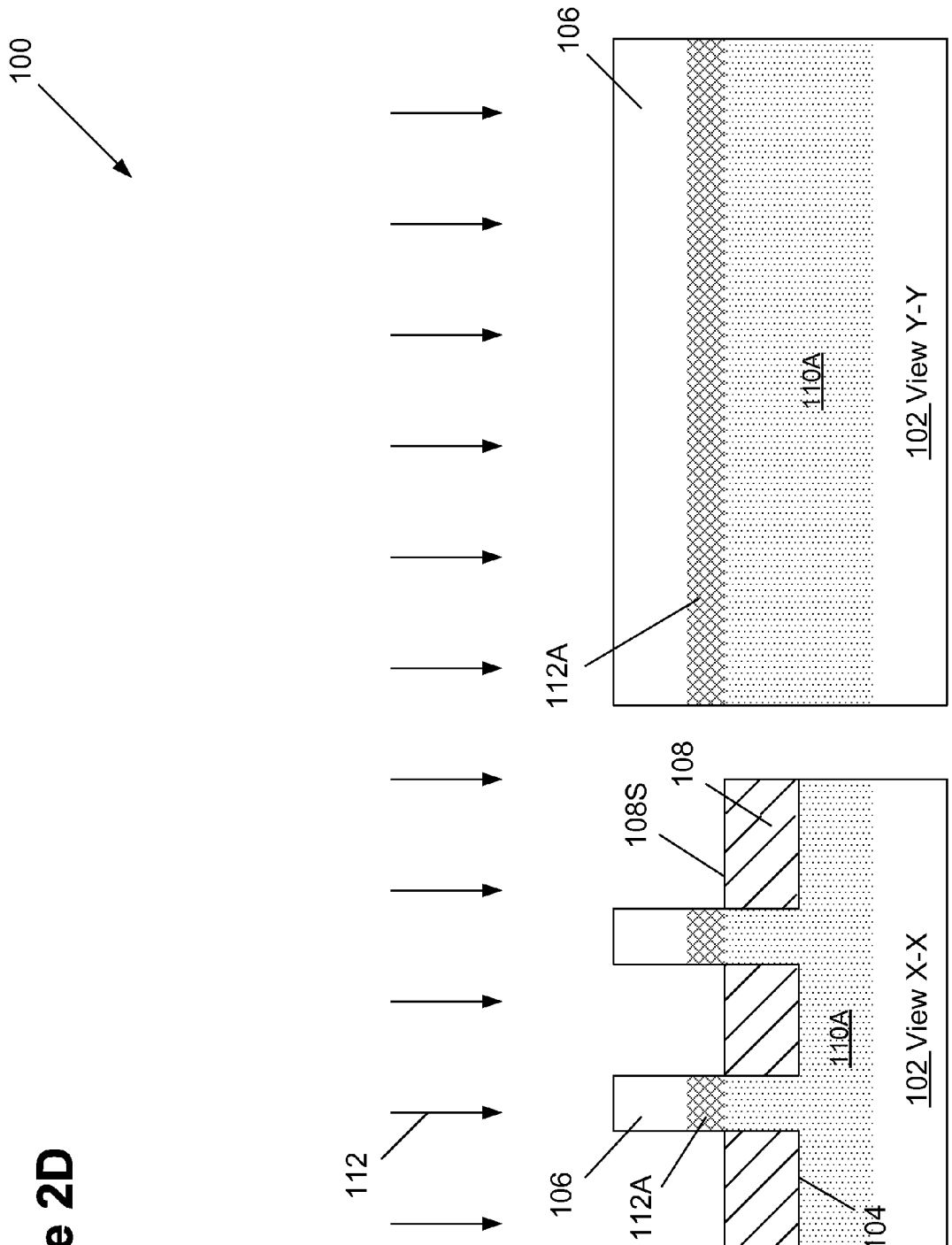

FIG. 2D depicts the device 100 after a punch-stop ion implantation process 112 was performed on the device 100 to define a punch-stop implant region 112A in the fins 106. In the case where the device is an N-type FinFET device, the punch-stop ion implantation process 112 may be performed using a P-type dopant material, such as boron or boron difluoride. The dopant dose and the implant energy used during the punch-stop implant process 112 may vary depending on the particular application. In one illustrative embodiment, the punch-stop implant process 112 may be performed using a dopant dose that falls within the range of $5e^{12}-1e^{14}$ ion/cm² and using an energy level that falls within the range of 1-100 keV. The dopant concentration of the punch-stop implant region 112A may also vary depending upon the particular application. In one illustrative embodiment, the punch-stop implant region 112A may have a dopant concentration of about $1e^{17}-1e^{19}$ ion/cm³. In one embodiment, the vertical distance between the punch-stop implant region 112A and the top of the fin 106 may be about 30-50 nm.

FIG. 2E depicts the device 100 after one or more neutral ion implantation processes 114 were performed on the device 100 to define a neutral boron-diffusion-blocking implant region 114A in the substrate 102. In the case where the device is an N-type FinFET device, the neutral ion implantation process (es) 114 may be performed using one or more neutral materials, i.e., a non-N-type or non-P-type material, as the implanted material(s), e.g., carbon alone, carbon and germanium, carbon and germanium and nitrogen, carbon and nitrogen, germanium and nitrogen, etc. The neutral boron-diffusion-blocking implant region 114A may be formed by performing one or multiple implantation processes. The dose of the neutral material and the implant energy used during the neutral ion implantation process(es) 114 may vary depending on the particular application. In the case where carbon alone is implanted to form the boron-diffusion-blocking implant region 114A, a single ion implantation process 114 may be performed using a dose of carbon that falls within the range of $1e^{13}-5e^{14}$ ion/cm² and an energy level that falls within the range of 5-10 keV. In the case where nitrogen alone is used to form the neutral boron-diffusion-blocking implant region 114A, the nitrogen may be implanted using similar implant conditions to those described above with respect to the use of boron alone to form the neutral boron-diffusion-blocking implant region 114A.

In the case where a combination of different neutral materials are implanted to form the neutral boron-diffusion-blocking implant region 114A, e.g., carbon and germanium, two (or more) separate neutral ion implantation processes 114 may be performed, and, in this example, the carbon and germanium may be implanted in any desired order. In one illustrative embodiment, the carbon ion implantation process 114 may be performed using a dose of carbon that falls within the range of $1e^{13}-1e^{15}$ ion/cm² and an energy level that falls within the range of 1-50 keV, while the germanium implantation process 114 may be performed using a dose of germanium that falls within the range of $1e^{13}-1e^{15}$ ion/cm² and an energy level that falls within the range of 1-50 keV. In one very particular example, the neutral boron-diffusion-blocking implant region 114A may be formed by performing a first implant process 114 using a dose of carbon of about $4e^{13}$ ion/cm² and an energy level of about 8 keV, while the germanium implantation process 114 may be performed using a dose of germanium of about $3e^{13}$ ion/cm² and an energy level of about 35 keV.

The concentration of the neutral material in the neutral boron-diffusion-blocking implant region 114A may also vary depending upon the particular application. In one illustrative embodiment, the neutral boron-diffusion-blocking implant region 114A may have a concentration of the implanted neutral materials that falls within the range of about $5e^{17}-5e^{19}$ ion/cm³. In one embodiment, the vertical thickness of the neutral boron-diffusion-blocking implant region 114A may be about 20-50 nm. The distance 116 between the upper surface 106S of the fins 106 and the upper surface of the neutral boron-diffusion-blocking implant region 114A may be about 20-40 nm based upon current-day technology.

Figure 2F:
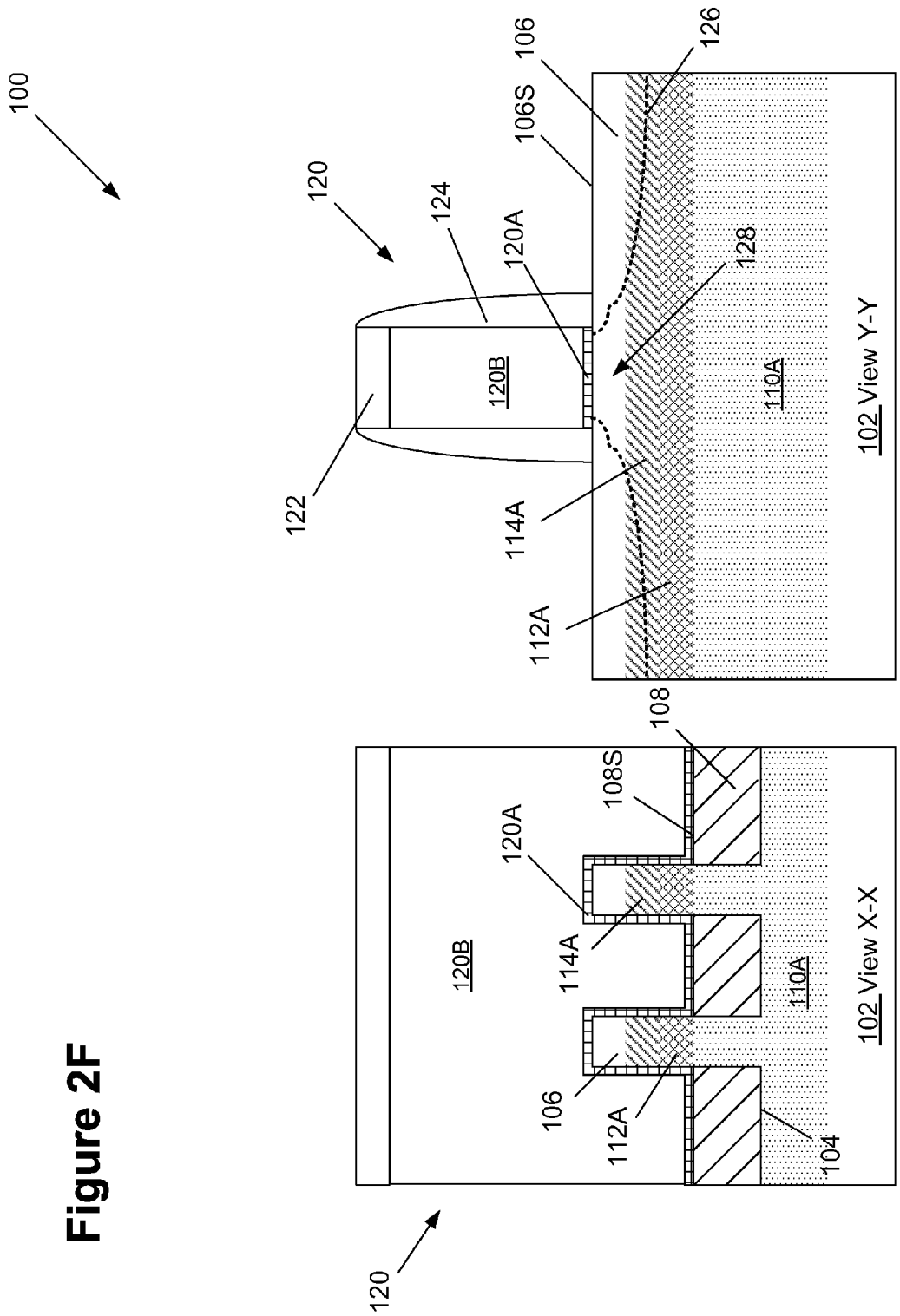

FIG. 2F depicts the device 100 after an illustrative and schematically depicted gate structure 120 was formed on the device 100. The gate structure 120 depicted herein is intended to be representative in nature of and it may be formed using well-known gate-first or well-known replacement gate techniques. Also depicted are an illustrative gate cap layer 122 and sidewall spacers 124. The gate structure 120 may comprise an illustrative gate insulation layer 120A made of a material such as a high-k material (k value greater than 10) or silicon dioxide. The gate structure 120 may also comprise a schematically depicted gate electrode 120B. In one illustrative embodiment, the illustrative gate electrode 120 may be comprised of one or more layers of metal or polysilicon. The gate cap layer 122 and the sidewall spacers 124 may be formed from a variety of different materials, e.g., typically silicon nitride and/or low-k materials. Also depicted in FIG. 2F are dashed lines 126 that correspond to the formation of illustrative source/drain regions in the substrate 102. The source/drain regions 126 may be formed by performing traditional ion implantation techniques and/or epitaxially grown silicon-phosphorus layers. As depicted, the neutral boron-diffusion-blocking implant region 114A is positioned under the channel region 128 of the device and spaced vertically below the upper surface of the fin 106S by a distance 116 (see FIG. 2E). Also note that the upper surface of the neutral boron-diffusion-blocking implant region 114A is positioned closer to the upper surface of the fin 106 than either of the implant regions 110A, 112A.

As its name implies, the purpose of the neutral boron-diffusion-blocking implant region 114A is to stop or limit up-diffusion of the implanted boron in the punch-stop implant region 112A and/or the well implant region 110A into the channel region 128 of the FinFET device 100. The inventors have discovered that, by forming the neutral boron-diffusion-blocking implant region 114A described herein, significant and unexpected benefits may be observed in long-channel N-type FinFET devices. As used herein, the term "long-channel" devices generally means devices having a gate length greater than about 50 nm. For example, in the case where the neutral boron-diffusion-blocking implant region 114A was formed using carbon and germanium (carbon dose of about $5e^{13}$ ion/cm²; germanium dose of about $5e^{13}$ ion/cm²), the threshold voltage of as-built long-channel N-type FinFET devices increased, thereby making the threshold voltage of the as-built long-channel N-type FinFET devices substantially match the target threshold voltage for the long-channel N-type FinFET devices. Additionally, the inventors observed that, while the formation of the neutral boron-diffusion-blocking implant region 114A improved or modified various electrical aspects of the long-channel N-type FinFET devices, the formation of the neutral boron-diffusion-blocking implant region 114A in short-channel N-type FinFET devices (gate lengths of about 40 nm or less) also improved the short channel effect, thereby improving the device performance, without any significant adverse effects on the performance or characteristics of such short-channel N-type FinFET devices.

More specifically, the inventors performed testing on several different versions of N-type FinFET devices with channel lengths varying from about 14 nm to about 250 nm. Based upon that testing, by forming the above-described neutral boron-diffusion-blocking implant region 114A (carbon+germanium) in the devices, the threshold voltage of the as-built long-channel N-type FinFET devices increased by about +50-150 mv, thereby resulting in the threshold voltage of the as-built devices substantially matching the target threshold voltage for the long-channel N-type FinFET devices. The formation of the neutral boron-diffusion-blocking implant region 114A also had the desirable effect of improving the $I_{on}/I_{off}$ electrical characteristic of the short-channel N-type FinFET devices by about 5-10% and reducing the DIBL (drain-induced-barrier-lowering) characteristic of the short-channel N-type FinFET devices by about 30-50 mV. Additionally, formation of the neutral boron-diffusion-blocking implant region 114A has the added benefit of tending to desirably restrict the movement or migration of the implanted N-type dopant materials in the source/drain regions. As can be seen from the foregoing, the formation of the neutral boron-diffusion-blocking implant region 114A limits up-diffusion of boron into the channel region of the device so as to help modulate the threshold voltage of the long-channel devices and improve the performance of short-channel devices. For a FinFET device, long-channel device threshold voltage is more sensitive than short-channel device threshold voltage to the concentration of germanium and carbon in the boron-diffusion-blocking layer 114A, and therefore the presence of the boron-diffusion-blocking layer 114A helps to modulate and set the long-channel threshold voltage on a desired target value without significant adverse change in short-channel threshold voltage characteristics.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a FinFET device having spaced-apart source/drain regions and a channel region positioned between said spaced-apart source/drain regions, the method comprising:

forming a plurality of trenches in a semiconductor substrate to thereby define a fin;

performing a well ion implantation process to form a well implant region in at least said substrate;

performing a punch-stop implant process to form a punch-stop implant region in said fin;

performing at least one neutral implantation process with at least one neutral implant material to form a neutral boron-diffusion-blocking implant region in said fin, wherein said neutral boron-diffusion-blocking implant region is positioned under what will become said channel region of said device and extends into what will become said source/drain regions of said device, and wherein an upper surface of said neutral boron-diffusion-blocking implant region is positioned closer to an upper surface of said fin than either said punch-stop implant region or said well implant region; and after forming said well implant region, said punch-stop implant region and said neutral boron-diffusion-blocking implant region, forming a gate structure above said fin.

2. The method of claim 1, wherein said FinFET device is an N-type FinFET device.

3. The method of claim 1, wherein said well ion implantation process was performed using a P-type dopant material, using a dopant dose that falls within the range of $1e^{12}$-$1e^{14}$ ions/cm$^2$ and an energy level that falls within the range of 1-100 keV.

4. The method of claim 1, wherein the dopant concentration of said well implant region has a dopant concentration of about $1e^{17}$-$1e^{19}$ ions/cm$^3$.

5. The method of claim 1, wherein said punch-stop implant process was performed using a P-type dopant material, using a dopant dose that falls within the range of $5e^{12}$-$1e^4$ ions/cm$^2$ and an energy level that falls within the range of 10-50 keV.

6. The method of claim 1, wherein the dopant concentration of said punch-stop implant region has a dopant concentration of about $1e^{17}$-$1e^{19}$ ions/cm$^3$.

7. The method of claim 1, wherein said at least one neutral implantation process was performed using a single neutral implant material, using a dose of said single neutral implant material that falls within the range of $1e^{13}$-$5e^{14}$ ions/cm$^2$ and an energy level that falls within the range of 5-10 keV.

8. The method of claim 1, wherein said neutral boron-diffusion-blocking implant region has a concentration of said at least one neutral implant material of about $5e^{17}$-$5e^{19}$ ions/cm$^3$.

9. The method of claim 1, wherein said at least one neutral implant material is comprised of carbon, a combination carbon and germanium, a combination of carbon, germanium and nitrogen or a combination of germanium and nitrogen.

10. The method of claim 1, wherein said at least one neutral implant material is comprised of carbon and germanium.

11. The method of claim 10, wherein performing said at least one neutral implantation process with said at least one neutral implant material to form said neutral boron-diffusion-blocking implant region in said fin comprises performing a carbon ion implantation process and a germanium ion implantation process to form a neutral boron-diffusion-blocking implant region that is comprised of carbon and germanium.

12. The method of claim 11, wherein said carbon ion implantation process is performed using a dose of carbon of about $4e^{13}$ ions/cm$^2$ and said germanium ion implantation process is performed using a dose of germanium of about $3e^{13}$ ions/cm$^2$.

13. The method of claim 11, wherein said carbon ion implantation process is performed using a dose of carbon that falls within the range of $1e^{13}$-$5e^{14}$ ions/cm$^2$ and an energy level that falls within the range of 5-10 keV, and said germanium ion implantation process is performed using a dose of germanium that falls within the range of $1e^{13}$-$5e^{14}$ ions/cm$^2$ and an energy level that falls within the range of 25-45 keV.

14. The method of claim 1, wherein said punch-stop implant process is performed after said well ion implantation process is performed and said at least one neutral implantation process is performed after said punch-stop implant process is performed.

15. The method of claim 1, further comprising forming a source/drain contact structure within each of said source/drain regions after forming said gate structure.

16. A method of forming an N-type FinFET device having spaced-apart source/drain regions and a channel region positioned between said spaced-apart source/drain regions, the method comprising:
 forming a plurality of trenches in a semiconductor substrate to thereby define a fin;
 performing a well ion implantation process to form a well implant region in at least said substrate;
 performing a punch-stop implant process to form a punch-stop implant region in said fin;
 forming a neutral boron-diffusion-blocking implant region comprised of carbon and germanium in said fin, wherein said neutral boron-diffusion-blocking implant region is positioned under what will become said channel region of said device and extends into what will become said source/drain regions of said device, and wherein an upper surface of said neutral boron-diffusion-blocking implant region is positioned closer to an upper surface of said fin than either said punch-stop implant region or said well implant region by performing a carbon ion implantation process and a germanium ion implantation process; and
 after forming said well implant region, said punch-stop implant region and said neutral boron-diffusion-blocking implant region, forming a gate structure above said fin.

17. The method of claim 16, wherein said carbon ion implantation process is performed using a dose of carbon of about $5e^{13}$ ions/cm$^2$ and said germanium ion implantation process is performed using a dose of germanium of about $5e^{13}$ ions/cm$^2$.

18. The method of claim 16, wherein said carbon ion implantation process is performed using a dose of carbon that falls within the range of $1e^{13}$-$5e^{14}$ ions/cm$^2$ and an energy level that falls within the range of 5-10 keV, and said germanium ion implantation process is performed using a dose of germanium that falls within the range of $1e^{13}$-$5e^{14}$ ions/cm$^2$ and an energy level that falls within the range of 25-45 keV.

19. The method of claim 16, wherein said carbon ion implantation process is performed before said germanium ion implantation process.

20. The method of claim 16, wherein said germanium ion implantation process is performed before said carbon ion implantation process.

21. The method of claim 16, wherein said neutral boron-diffusion-blocking implant region has a concentration of carbon of about $5e^{17}$-$5e^{19}$ ions/cm$^3$, and a concentration of germanium of about $5e^{17}$-$5e^{19}$ ions/cm$^3$.

* * * * *